(12) United States Patent
Masuzawa

(10) Patent No.: US 12,482,758 B2
(45) Date of Patent: Nov. 25, 2025

(54) SUBSTRATE FOR POWER MODULE AND METHOD OF PRODUCING SUBSTRATE FOR POWER MODULE

(71) Applicant: MITSUBISHI HEAVY INDUSTRIES, LTD., Tokyo (JP)

(72) Inventor: Takashi Masuzawa, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 399 days.

(21) Appl. No.: 18/177,927

(22) Filed: Mar. 3, 2023

(65) Prior Publication Data

US 2023/0282589 A1   Sep. 7, 2023

(30) Foreign Application Priority Data

Mar. 7, 2022 (JP) ................................ 2022-034300

(51) Int. Cl.
 *H01L 23/538* (2006.01)
 *H01L 21/48* (2006.01)
 (Continued)

(52) U.S. Cl.
 CPC ...... *H01L 23/5386* (2013.01); *H01L 21/4839* (2013.01); *H01L 23/562* (2013.01);
 (Continued)

(58) Field of Classification Search
 None
 See application file for complete search history.

(56) References Cited

U.S. PATENT DOCUMENTS

| 2011/0089805 A1 | 4/2011 | Betsuda et al. |
| 2020/0194386 A1 | 6/2020 | Uezato |

FOREIGN PATENT DOCUMENTS

| DE | 112019001086 T5 | 11/2020 |
| JP | 2006-140401 A | 6/2006 |

(Continued)

OTHER PUBLICATIONS

English abstract of JP 2021-097071 (Year: 2021).*
Machine-generated English translation of JP 2021-097071 (Year: 2001).*

*Primary Examiner* — Bo B Jang
(74) *Attorney, Agent, or Firm* — Osha Bergman Watanabe & Burton LLP

(57) ABSTRACT

A substrate for a power module of the present disclosure includes: an insulation sheet; a plurality of front surface patterns formed on a front surface of the insulation sheet and disposed adjacent to each other with a gap between the plurality of front surface patterns in a direction in which the insulation sheet expands; a power semiconductor element connected to the front surface pattern; a plurality of rear surface patterns formed on a rear surface of the insulation sheet and disposed adjacent to each other with a gap between the plurality of rear surface patterns in the direction in which the insulation sheet expands; and a connection pattern disposed in the gap to fill the rear surface in the gap between the neighboring rear surface patterns of the plurality of rear surface patterns and configured to electrically connect the neighboring rear surface patterns, wherein each of the rear surface patterns and at least one front surface pattern overlap with the insulation sheet disposed therebetween in a direction perpendicular to the insulation sheet, and the plurality of rear surface patterns are formed so that thermal stress acting on the plurality of rear surface patterns and thermal stress acting on the plurality of front surface patterns are balanced.

4 Claims, 4 Drawing Sheets

(51) Int. Cl.
*H01L 23/00* (2006.01)
*H01L 25/07* (2006.01)
(52) U.S. Cl.
CPC ............ *H01L 25/072* (2013.01); *H01L 24/32* (2013.01); *H01L 24/48* (2013.01); *H01L 24/73* (2013.01); *H01L 2224/32225* (2013.01); *H01L 2224/48225* (2013.01); *H01L 2224/73265* (2013.01); *H01L 2924/13055* (2013.01); *H01L 2924/13091* (2013.01)

(56) References Cited

FOREIGN PATENT DOCUMENTS

| | | | |
|---|---|---|---|
| JP | 2013-157550 | A | 8/2013 |
| JP | 2020-058126 | A | 4/2020 |
| JP | 2021097071 | A * | 6/2021 |
| WO | 2021/085234 | A1 | 5/2021 |

* cited by examiner

SUBSTRATE FOR POWER MODULE AND METHOD OF PRODUCING SUBSTRATE FOR POWER MODULE

CROSS-REFERENCE TO RELATED APPLICATION

Priority is claimed on Japanese Patent Application No. 2022-034300, filed Mar. 7, 2022, the content of which is incorporated herein by reference.

FIELD OF THE INVENTION

Background of the Invention

The present disclosure relates to a substrate for a power module and a method of producing a substrate for a power module.

Description of Related Art

For example, Japanese Unexamined Patent Application, First Publication No. 2013-157550 discloses a power module semiconductor device in which a second plate layer as a heat radiation sheet disposed on a rear surface of a ceramic substrate is divided by grooves and which is sealed with a resin by transfer molding. When a sealing resin is filled in the grooves formed in the second plate layer, the warping (deformation) of the entire module caused by a difference in thermal stress between the resin and the ceramic substrate is reduced.

SUMMARY OF THE INVENTION

Incidentally, when a current flowing through the first plate layer disposed on a surface changes (magnetic flux density change), a back electromotive force is generated in the second plate layer and an overcurrent flows therein. At this time, since the second plate layer is divided by the grooves, a path of the overcurrent flowing through the second plate layer is blocked. For this reason, a magnetic flux of the current flowing through the first plate layer and a magnetic flux of the overcurrent flowing through the second plate layer may not cancel each other out smoothly in some cases. As a result, parasitic inductance may increase in some cases.

The present disclosure is made to solve the above problems and an object of the present disclosure is to provide a substrate for a power module capable of reducing parasitic inductance while preventing deformation thereof caused by generation of thermal stress and a method of producing a substrate for a power module.

In order to achieve the above object, a substrate for a power module according to the present disclosure includes: an insulation sheet; a plurality of front surface patterns formed on a front surface of the insulation sheet and disposed adjacent to each other with a gap between the plurality of front surface patterns in a direction in which the insulation sheet expands; a power semiconductor element connected to the front surface pattern; a plurality of rear surface patterns formed on a rear surface of the insulation sheet and disposed adjacent to each other with a gap between the plurality of rear surface patterns in the direction in which the insulation sheet expands; and a connection pattern disposed in the gap to fill the rear surface in the gap between the neighboring rear surface patterns of the plurality of rear surface patterns and configured to electrically connect the neighboring rear surface patterns, in which each of the rear surface patterns and at least one front surface pattern of the plurality of front surface patterns overlap with the insulation sheet disposed therebetween in a direction perpendicular to the insulation sheet, and the plurality of rear surface patterns are formed so that thermal stress acting on the plurality of rear surface patterns and thermal stress acting on the plurality of front surface patterns are balanced.

A method of producing a substrate for a power module according to the present disclosure includes: a front surface pattern formation step of forming a plurality of front surface patterns disposed adjacent to each other with a gap between the plurality of front surface patterns in a direction in which an insulation sheet expands on a front surface of the insulation sheet; a rear surface pattern formation step of forming a plurality of rear surface patterns disposed adjacent to each other with a gap between the plurality of rear surface patterns in the direction in which the insulation sheet expands on a rear surface of the insulation sheet; a connection pattern formation step of forming a connection pattern disposed in the gap between the neighboring rear surface patterns of the plurality of rear surface patterns to fill the rear surface in the gap between the neighboring rear surface patterns and electrically connecting the neighboring rear surface patterns; and a power semiconductor element connection step of connecting a power semiconductor element to the front surface pattern, in which each of the rear surface patterns and at least one front surface pattern of the plurality of front surface patterns overlap with the insulation sheet disposed therebetween in a direction perpendicular to the insulation sheet, and the plurality of rear surface patterns are formed so that thermal stress acting on the plurality of rear surface patterns and thermal stress acting on the plurality of front surface patterns are balanced.

According to the present disclosure, it is possible to provide a substrate for a power module capable of reducing parasitic inductance while preventing deformation thereof caused by generation of thermal stress and a method of producing a substrate for a power module.

DETAILED DESCRIPTION OF THE INVENTION

A power conversion device according to an embodiment are described below with reference to the drawings.
(Power Conversion Device)

A power conversion device is a device which converts direct current (DC) power into three-phase alternating current (AC) power or the like. Examples of the power conversion device in the embodiment include inverters used in systems such as power plants, inverters used for driving electric motors of electric vehicles or the like. In the embodiment, an inverter configured to control an electric motor (motor) is described as an example of the power conversion device.

Figure 1:
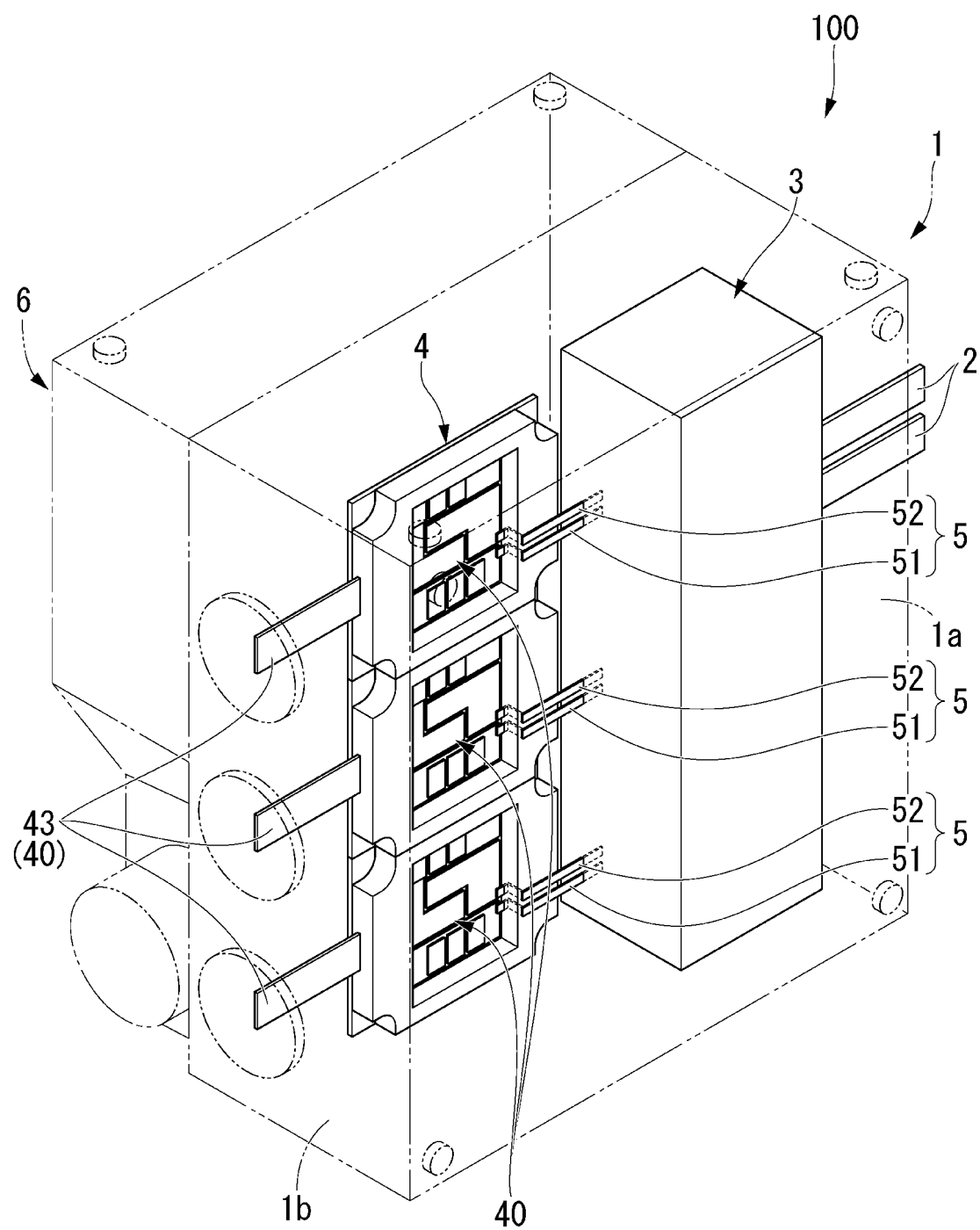
FIG. 1 is a perspective view illustrating a schematic configuration of a power conversion device according to an embodiment of the present disclosure.

As illustrated in FIG. 1, a power conversion device 100 includes a casing 1, an external input conductor 2, a capacitor 3, a power conversion part 4, a connection conductor 5, and a cooling device 6.

(Casing)

The casing 1 forms an outer shell of the power conversion device 100. The casing 1 in the embodiment is made of a metal such as aluminum, a synthetic resin, or the like and has a rectangular parallelepiped shape. The casing 1 has two lateral surfaces which are disposed back-to-back. Hereinafter, the two lateral surfaces are referred to as an input-side lateral surface 1a and an output-side lateral surface 1b. The external input conductor 2 configured to receive DC power as an input is drawn (protrudes) from the input-side lateral surface 1a.

(External Input Conductor)

The external input conductor 2 is a pair of electrical conductors (bus bars) which supply DC power supplied from a DC power supply provided outside the power conversion device 100 to the capacitor 3. The external input conductor 2 in the embodiment is formed of a metal including copper or the like. One end of the external input conductor 2 is connected to the capacitor 3 and the other end of the external input conductor 2 extends in a direction in which the other end crosses the input-side lateral surface 1a of the casing 1.

(Capacitor)

The capacitor 3 is a smoothing capacitor configured to store electric charge input from the external input conductor 2 and prevent voltage fluctuation caused by power conversion. The ripple-prevented and smoothed DC voltage is supplied to the power conversion part 4 through the capacitor 3.

(Power Conversion Part)

The power conversion part 4 converts a voltage input from the capacitor 3. The power conversion part 4 in the embodiment includes three power modules 40 which are respectively responsible for outputs for a U phase, a V phase, and a W phase to output three-phase alternating current power. A constitution of the power modules 40 in the embodiment is described in detail later.

(Connection Conductor)

The connection conductor 5 is an electrical conductor (bus bar) configured to transmit electric power from the capacitor 3 to the power conversion part 4. One end of the connection conductor 5 is connected to the capacitor 3 (detailed illustration of a connection state of the connection conductor 5 and the capacitor 3 is omitted). The other end of the connection conductor 5 is connected to the power module 40.

The connection conductor 5 includes a first conductor 51 and a second conductor 52. The first conductor 51 is a current path connecting a positive electrode (not shown) in the capacitor 3 and a positive electrode in the power module 40. The second conductor 52 is a current path connecting a negative electrode (not shown) in the capacitor 3 and a negative electrode in the power module 40. The first conductor 51 and the second conductor 52 are disposed side by side with an interval therebetween.

(Cooling Device)

The cooling device 6 is a device which mainly cools the power modules 40 of the power conversion part 4. The cooling device 6 is provided to be laminated on the casing and is fixed and integrated with the casing 1. A liquid cooling medium such as water is introduced into the cooling device 6 from the outside. The liquid cooling medium is heated through heat-exchanging with the power modules 40 so that the power modules 40 are cooled.

(Power Module)

Figure 2:
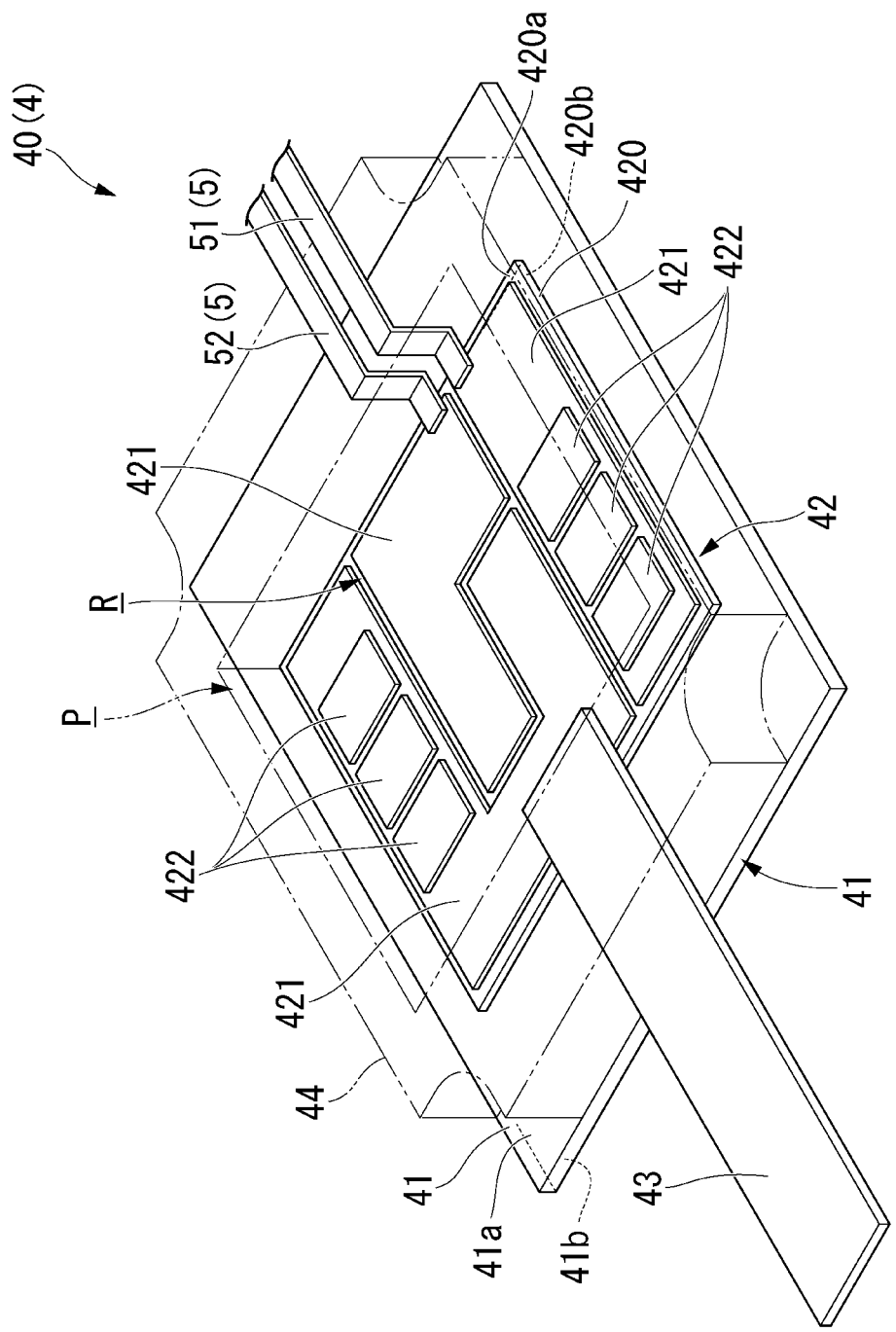
FIG. 2 is a perspective view of a power module according to the embodiment of the present disclosure.

The power modules 40 are devices in which input electric power is converted and output. The power modules 40 in the embodiment constitute a part of the power conversion part 4. As illustrated in FIG. 2, the power module 40 includes a base plate 41, a substrate 42 for a power module, an outside output conductor 43, and a reinforcing part 44.

(Base Plate)

The base plate 41 is a member having a flat shape. The base plate 41 has a first surface 41a and a second surface 41b facing a side opposite to that of the first surface 41a. That is to say, the first surface 41a and the second surface 41b of the base plate 41 are disposed back-to-back in a state in which they are parallel each other.

The second surface 41b of the base plate 41 is fixed to, for example, the cooling device 6 through a bonding material or the like (not shown). For example, copper is adopted for the base plate 41 in the embodiment. A metal such as aluminum may be adopted for the base plate 41.

(Substrate for Power Module)

Figure 3:
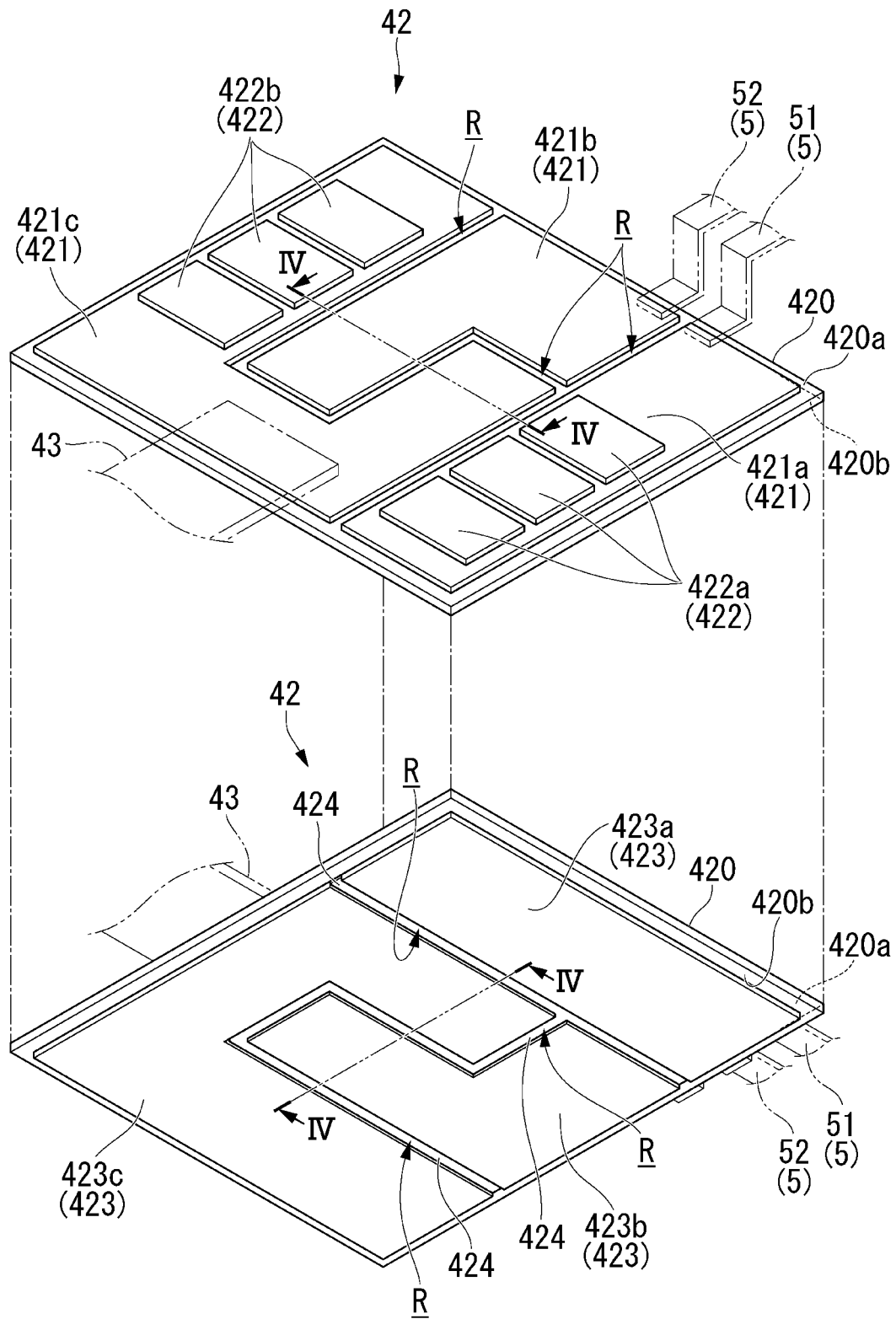
FIG. 3 is a perspective view illustrating a front surface side and a rear surface side of an insulation sheet in the substrate for a power module according to the embodiment of the present disclosure.
Figure 4:
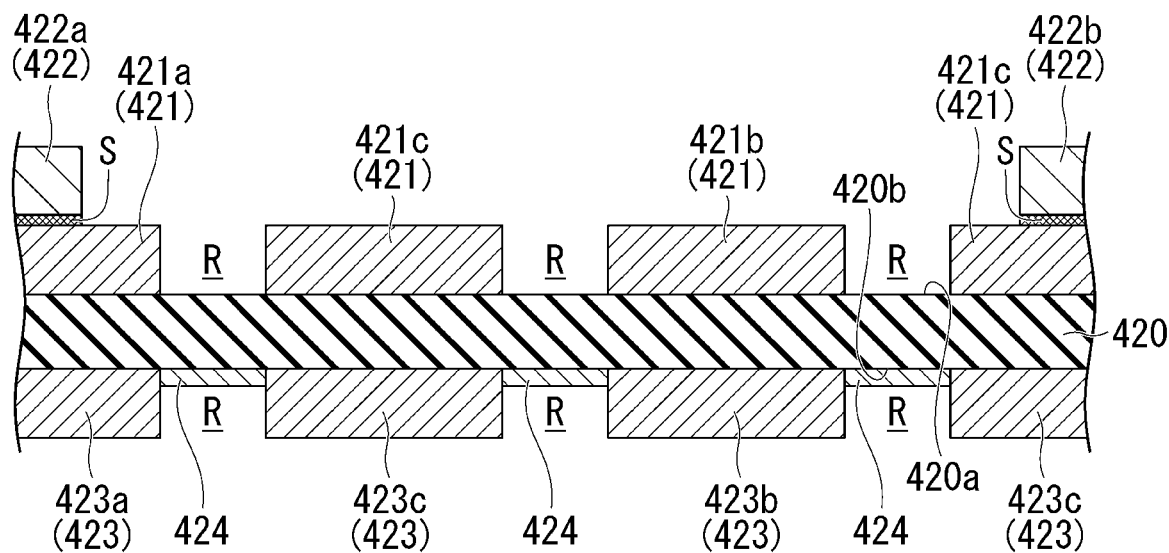
FIG. 4 is a partial cross-sectional view taken along line IV-IV illustrated in FIG. 3 and is a diagram illustrating a disposition relationship among a front surface pattern, a rear surface pattern, and a connection pattern.

As illustrated in FIGS. 3 and 4, the substrate 42 for a power module includes an insulation sheet 420, front surface patterns 421, power semiconductor elements 422, rear surface patterns 423, and a connection pattern 424.

(Insulation Sheet)

The insulation sheet 420 has a flat plate shape. The insulation sheet 420 has a front surface 420a and a rear surface 420b facing a side opposite to that of the front surface 420a. That is to say, the front surface 420a and the rear surface 420b of the insulation sheet 420 are disposed back-to-back in a state in which they are parallel each other.

The insulation sheet 420 in the embodiment is formed of, for example, an insulation material such as a ceramic. As the insulation material forming the insulation sheet 420, instead of a ceramic, paper phenol, paper epoxy, a glass composite, glass epoxy, glass polyimide, a fluorine resin, or the like can be used.

(Front Surface Pattern)

The front surface patterns 421 are patterns of a copper foil or the like formed on the front surface 420a of the insulation sheet 420 and expanding in a plane shape. The front surface patterns 421 are formed, for example, by being subjected to etching or the like after being fixed to the front surface 420a of the insulation sheet 420 using adhesion or the like. A thickness of the front surface pattern 421 in the embodiment is set to 200 to 800 μm.

The plurality of front surface patterns 421 are disposed on the front surface 420a of the insulation sheet 420. The plurality of front surface patterns 421 are disposed adjacent to each other with a gap R therebetween in a direction in which the insulation sheet 420 expands. In the embodiment, a case in which the three front surface patterns 421 are disposed on the front surface 420a is described as an example. These three front surface patterns 421 are formed to have the same thickness.

For convenience of explanation, hereinafter these three front surface patterns 421 are referred to as a first front surface pattern 421a, a second front surface pattern 421b, and a third front surface pattern 421c.

The first conductor 51 as a positive electrode configured to receive a DC current as an input is connected to the first front surface pattern 421a. The second conductor 52 as a negative electrode configured to output a DC current is connected to the second front surface pattern 421b. The outside output conductor 43 configured to output an AC current obtaining through conversion using the power semiconductor elements 422 to a load such as a motor or the like (not shown) provided outside the power conversion device 100 is connected to the third front surface pattern 421c.

(Power Semiconductor Element)

The power semiconductor elements 422 are circuit elements in which electric power is converted through a switching operation in which a voltage and a current is turned on and off. The power semiconductor elements 422 are, for example, switching elements such as an insulated gate bipolar transistor (IGBT) and a metal-oxide-semiconductor field effect transistor (MOSFET). In the embodiment, the six power semiconductor elements 422 are connected to the front surface patterns 421 of the substrate 42 for a power module.

The six power semiconductor elements 422 in the embodiment are composed of three first power semiconductor elements 422a and three second power semiconductor elements 422b. The first power semiconductor elements 422a are connected to the first front surface pattern 421a. The second power semiconductor elements 422b are connected to the third front surface pattern 421c.

When the power semiconductor elements 422 are IGBTs, each of the power semiconductor elements 422 has an input surface on which an input terminal corresponding to a collector is formed, an output surface on which an output terminal corresponding to an emitter is formed, and a gate corresponding to a control signal input terminal configured to control switching of the power semiconductor element 422.

An input surface of the power semiconductor element 422 is electrically connected to the front surface patterns 421 through a bonding material S or the like. For example, one end of a bonding wire (not shown) as a conducting wire is electrically connected to the output surface of the power semiconductor element 422.

An input surface of the first power semiconductor element 422a is connected to the first front surface pattern 421a. The other end of the bonding wire connected to an output surface of the first power semiconductor element 422a is connected to the third front surface pattern 421c. An input surface of each of the second power semiconductor elements 422b is connected to the third front surface pattern 421c. The other end of the bonding wire connected to an output surface of the second power semiconductor element 422b is connected to the second front surface pattern 421b.

DC power is input to an input terminal of each of the first power semiconductor elements 422a through the first front surface pattern 421a and the input DC power is converted into AC power by the first power semiconductor element 422a. The converted AC power is output from an output terminal (not shown) in the first power semiconductor element 422a to the third front surface pattern 421c through the bonding wire.

AC power is input to an input terminal in the second power semiconductor element 422b through the third front surface pattern 421c and the input AC power is converted into DC power by the second power semiconductor element 422b. The converted DC power is output from an output terminal (not shown) in the second power semiconductor element 422b to the second front surface pattern 421b through the bonding wire.

A control signal generated by a control part (not shown) provided outside the substrate 42 for a power module is input to the power semiconductor element 422. The power semiconductor element 422 performs switching in accordance with the control signal. When the power semiconductor elements 422 are MOSFETs, each of the power semiconductor elements 422 includes an input surface corresponding to a drain, an output surface corresponding to a source, and a gate corresponding to a control signal input terminal.

(Rear Surface Pattern)

The rear surface patterns 423 are patterns of a copper foil or the like formed on the rear surface 420b of the insulation sheet 420 and expanding in a plane shape. The rear surface patterns 423 are formed, for example, by being subjected to etching or the like after being fixed to the rear surface 420b of the insulation sheet 420 using adhesion or the like. The plurality of rear surface patterns 423 are disposed on the rear surface 420b of the insulation sheet 420. A thickness of each of the rear surface patterns 423 in the embodiment is the same as a thickness of each of the front surface patterns 421.

The plurality of rear surface patterns 423 are disposed adjacent to each other with a gap R in a direction in which the insulation sheet 420 expands. In the embodiment, a case in which the three rear surface patterns 423 are disposed on the front surface 420a is described as an example. For convenience of explanation, hereinafter these three rear surface patterns 423 are referred to as a first rear surface pattern 423a, a second rear surface pattern 423b, and a third rear surface pattern 423c.

The first rear surface pattern 423a in the embodiment faces the first front surface pattern 421a with the insulation sheet 420 disposed therebetween in a direction perpendicular to the insulation sheet 420. The first rear surface pattern 423a and the first front surface pattern 421a have the same shape. The "same shape" as described herein refers to substantially the same shape and slight production errors and design tolerances therein are allowed.

The second rear surface pattern 423b in the embodiment faces the second front surface pattern 421b with the insulation sheet 420 disposed therebetween in the direction perpendicular to the insulation sheet 420. The second rear surface pattern 423b and the second front surface pattern 421b have the same shape. The third rear surface pattern 423c in the embodiment faces the third front surface pattern 421c with the insulation sheet 420 disposed therebetween in the direction perpendicular to the insulation sheet 420. The third rear surface pattern 423c and the third front surface pattern 421c have the same shape.

Therefore, the front surface pattern 421 and the rear surface pattern 423 facing each other with the insulation sheet 420 disposed therebetween in the direction perpendicular to the insulation sheet 420 have the same shape. That is to say, the plurality of rear surface patterns 423 are formed so that the thermal stress acting on the plurality of rear surface patterns 423 and the thermal stress acting on the plurality of front surface patterns 421 are balanced.

The term "balance" of thermal stress described herein means that, when heat is distributed over the entire substrate 42 for a power module due to a current flowing through the front surface patterns 421 or heat generation due to switching of the power semiconductor element 422 as a heat source, magnitudes of the thermal stresses acting on the front surface pattern 421 and the rear surface pattern 423 are substantially the same. Therefore, it is considered that the thermal stresses are balanced in a state in which a difference in thermal stress caused by a temperature difference between the front surface pattern 421 and the rear surface pattern 423 due to a position of the heat source or the like is allowed.

The rear surface pattern 423 is fixed to a center of the first surface 41*a* of the base plate 41 through the bonding material S or the like. For example, solder, a sintered material (powder of a metal or the like), or the like can be adopted for the bonding material S used for bonding the base plate 41 and the rear surface pattern 423, bonding the power semiconductor element 422 and the front surface pattern 421, and bonding the base plate 41 and the cooling device 6.

(Connection Pattern)

The connection pattern 424 is a pattern of a copper foil or the like disposed with the gap R to fill the rear surface 420*b* in the gap R between the neighboring rear surface patterns 423. The connection pattern 424 electrically connects the neighboring rear surface patterns 423.

The rear surface pattern 423 is formed, for example, by being subjected to etching or the like after being fixed to the rear surface 420*b* of the insulation sheet 420 using adhesion or the like. A thickness of the connection pattern 424 is thinner than thicknesses of the front surface pattern 421 and the rear surface pattern 423. The thickness of the connection pattern 424 in the embodiment is assumed to be 50 μm or less.

(Outside Output Conductor)

As illustrated in FIGS. 2 and 3, the outside output conductor 43 is an electrical conductor (bus bar) configured to output the AC power which are converted by the power semiconductor element 422 to the outside of the power conversion device 100. One end of the outside output conductor 43 is connected to the third front surface pattern 421*c* in the substrate 42 for a power module.

Here, as illustrated in FIG. 1, the other end of the outside output conductor 43 extends further outward than the output-side lateral surface 1*b* of the casing 1. The other end of the outside output conductor 43 is connected to a current output wiring (not shown) connected to a load such as a motor.

(Reinforcing Part)

The reinforcing part 44 is a member which is fixed to the first surface 41*a* of the base plate 41 and mechanically reinforces the connection conductor 5 and the outside output conductor 43. The reinforcing part 44 is formed of a synthetic resin material or the like. The reinforcing part 44 covers a part of the connection portion and the outside output conductor 43 from the outside thereof and surrounds the substrate 42 for a power module from the outside thereof. That is to say, as illustrated in FIG. 2, the reinforcing part 44 forms a case which surrounds the substrate 42 for a power module in a direction along the substrate 42 for a power module (surrounds the substrate 42 for a power module along the circumference of the substrate 42 for a power module).

The reinforcing part 44 is fixed to the first surface 41*a* of the base plate 41 through an adhesive or the like. For the reinforcing part 44 in the embodiment, for example, an insulation material such as polyphenylene sulfide (PPS) can be adopted as a synthetic resin material. Insulation materials other than PPS may be adopted for the reinforcing part 44.

The reinforcing part 44 defines a space together with the substrate 42 for a power module. In the embodiment, hereinafter the space defined by the reinforcing part 44 and the substrate 42 for a power module is referred to as a potting space P. A liquid potting material is poured (potted) into the potting space P from the outside and the front surface pattern 421 and the power semiconductor element 422 of the insulation sheet 420 exposed in the potting space P are sealed.

A potting material poured into the potting space P is cured after a certain amount of time, and then, the front surface patterns 421 and the power semiconductor element 422 of the substrate 42 for a power module are electrically insulated from the space outside the power module 40. For example, silicone gel or an epoxy resin is adopted for the potting material in the embodiment. Synthetic resins other than the silicone gel or the epoxy resin may be used as the potting material.

(Method of Producing Substrate for Power Module)

Figure 5:
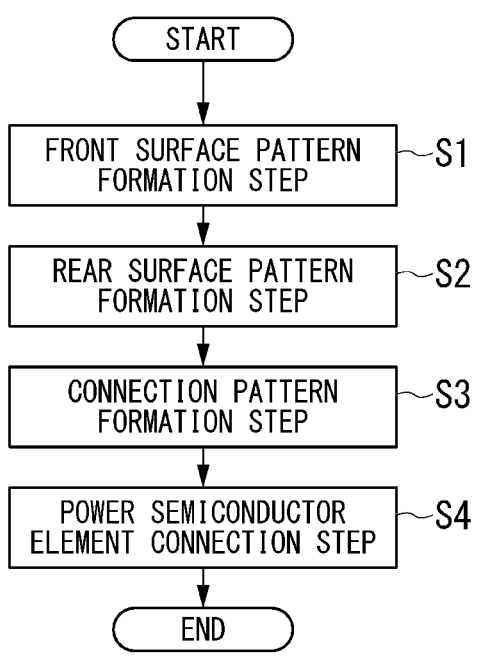
FIG. 5 is a flowchart for describing a method of producing a substrate for a power module according to an embodiment of the present disclosure.

A method of producing the substrate 42 for a power module in the embodiment is described below with reference to FIG. 5. The production method includes a front surface pattern formation step S1, a rear surface pattern formation step S2, a connection pattern formation step S3, and a power semiconductor element connection step S4.

(Front Surface Pattern Formation Step)

The front surface pattern formation step S1 is a step of forming the plurality of front surface patterns 421 on the front surface 420*a* of the insulation sheet 420. In the front surface pattern formation step S1, after a metal pattern of a copper foil or the like is fixed to the rear surface 420*b* of the insulation sheet 420 using adhesion or the like, processing such as etching is performed. Thus, the front surface patterns 421 are formed on the front surface 420*a* of the insulation sheet 420.

(Rear Surface Pattern Formation Step)

The rear surface pattern formation step S2 is a step performed after the front surface pattern formation step S1. In the rear surface pattern formation step S2, the plurality of rear surface patterns 423 are formed on the rear surface 420*b* of the insulation sheet 420. In the rear surface pattern formation step S2, after a metal pattern of a copper foil or the like is fixed to the rear surface 420*b* of the insulation sheet 420 using adhesion or the like, processing such as etching is performed. Thus, the rear surface patterns 423 are formed on the rear surface 420*b* of the insulation sheet 420.

(Connection Pattern Formation Step)

The connection pattern formation step S3 is a step performed after the rear surface pattern formation step S2. In the connection pattern formation step S3, the connection pattern 424 filling the rear surface 420*b* of the insulation sheet 420 in the gap R between the neighboring rear surface patterns 423 is formed. That is, in the connection pattern formation step S3, the connection pattern 424 filling the gap R between the neighboring rear surface patterns 423 is formed on the rear surface 420*b* of the insulation sheet 420.

In the connection pattern formation step S3, after a metal pattern of a copper foil or the like is fixed to the rear surface 420*b* of the insulation sheet 420 in the gap R between the neighboring rear surface patterns 423 using adhesion or the like, processing such as etching is performed. Thus, the connection pattern 424 is formed on the rear surface 420*b* of the insulation sheet 420 and the neighboring rear surface patterns 423 are electrically connected.

(Power Semiconductor Element Connection Step)

The power semiconductor element connection step S4 is a step performed after the connection pattern formation step S3. In the power semiconductor element connection step S4, the power semiconductor elements 422 are connected to the front surface patterns 421. In the power semiconductor element connection step S4, the bonding material S is applied to predetermined installation places on the front surface patterns 421.

Subsequently, the power semiconductor elements 422 are installed on the front surface pattern 421 so that the input surface of the power semiconductor element 422 is in contact with the bonding material S applied to the installation place of the front surface pattern 421. Furthermore, these parts are loaded inside a furnace heated to a predetermined temperature for a predetermined period of time. That is, the insulation sheet 420, on which the plurality of front surface patterns 421, the rear surface patterns 423 and the connection pattern 424 are formed, the bonding material S is applied and the power semiconductor elements 422 are installed, are loaded inside a furnace heated to a predetermined temperature for a predetermined period of time. Thus, the bonding material S between the input surface of the power semiconductor element 422 and the front surface pattern 421 is melted to complete soldering (installation of the power semiconductor elements 422).

Through the above series of steps, the substrate 42 for a power module is produced.

(Actions and Effects)

After a current input to the front surface pattern 421 through the first conductor 51 as a positive electrode is converted by the first power semiconductor element 422*a*, the converted current is used to rotate a motor or the like provided outside the power conversion device 100 through the outside output conductor 43. After the current used for the rotation of the motor or the like flows to the front surface pattern 421 again through the outside output conductor 43 and is converted by the second power semiconductor element 422*b*, the converted current returns to the capacitor 3 through the second conductor 52 as a negative electrode. When a voltage input to the front surface pattern 421 is converted by the power semiconductor element 422, heat is generated.

Also, since a magnitude of a current flowing in the front surface pattern 421 changes rapidly due to the switching of the power semiconductor element 422, a magnetic flux density of the current flowing in the front surface pattern 421 changes rapidly in accordance with the change of the magnitude of the current flowing in the front surface pattern 421. At this time, a back electromotive force (overcurrent) which generates a magnetic flux in which the change in magnetic flux density is cancelled out is generated in the rear surface pattern 423 formed on the rear surface 420*b* of the insulation sheet 420.

According to the above constitution, since a difference is not generated between the thermal stress acting on the front surface pattern 421 and the thermal stress acting on the rear surface pattern 423, the front surface pattern 421 and the rear surface pattern 423 thermally expand in the same way. Furthermore, since a thickness of the connection pattern 424 is thinner than a thickness of each of the rear surface pattern 423, it is possible to prevent the occurrence of a difference in thermal stress between the front surface 420*a* side and the rear surface 420*b* side, compared to the constitution in which the rear surface pattern 423 that is a single metal pattern having a uniform thickness is formed (the constitution in which, on the rear surface 420*b* of the insulation sheet 420, only one rear surface pattern 423 that is a metal pattern having a uniform thickness is formed and no connection pattern 424 is formed) is provided. Therefore, it is possible to prevent damage of the substrate 42 for a power module.

Also, an overcurrent, which is generated in the rear surface pattern 423 in accordance with the change in the magnetic flux density of the current flowing through the front surface pattern 421, flows through each of the rear surface patterns 423 through the connection pattern 424. That is to say, a path of the overcurrent flowing through the rear surface pattern 423 is not blocked, compared to the constitution in which the rear surface patterns 423 are not electrically connected.

Therefore, it is possible to effectively reduce parasitic inductance while preventing the deformation of the entire substrate 42 for a power module. That is to say, it is possible to prevent damage of the substrate 42 for a power module and improve the power conversion efficiency of the substrate 42 for a power module.

OTHER EMBODIMENTS

Although the embodiment of the present disclosure is described in detail above with reference to the drawings, the specific constitution is not limited to the constitution of the embodiment, and additions, omissions, substitutions and other modifications of the constitution may be provided without departing from the scope of the present disclosure.

Although a constitution in which the front surface pattern 421 and the rear surface pattern 423 facing each other with the insulation sheet 420 disposed therebetween in the direction perpendicular to the insulation sheet 420 have the same shape is described in the embodiment, the present disclosure is not limited to this constitution. That is to say, the shape of the front surface patterns 421 and the shape of the rear surface patterns 423 may be different from each other. In this case, each of the rear surface patterns 423 and at least one front surface pattern 421 of the plurality of front surface patterns 421 may overlap with the insulation sheet 420 disposed therebetween and the plurality of rear surface patterns 423 and the plurality of front surface patterns 421 may be formed so that the thermal stress acting on the plurality of rear surface patterns 423 and the thermal stress acting on the plurality of front surface patterns 421 are balanced.

Also, although the constitution in which the number of rear surface patterns 423 formed on the rear surface 420*b* of the insulation sheet 420 is the same as the number of front surface patterns 421 formed on the front surface 420*a* of the insulation sheet 420 and the thickness of the rear surface patterns 423 is the same as the thickness of the front surface patterns 421 is described in the embodiment, the present disclosure is not limited to this constitution. For example, a constitution in which the number of rear surface patterns 423 is greater than the number of front surface patterns 421 and the thickness of the rear surface pattern 423 is thinner than the thickness of the front surface pattern 421 may be provided. Furthermore, for example, a constitution in which the number of rear surface patterns 423 is less than the number of front surface patterns 421 and the thickness of the rear surface pattern 423 is greater than the thickness of the front surface pattern 421 may be provided. In these cases, each of the rear surface patterns 423 and at least one front surface pattern 421 of the plurality of front surface patterns 421 may overlap with the insulation sheet 420 disposed therebetween and the plurality of rear surface patterns 423 and the plurality of front surface patterns 421 may be formed so that the thermal stress acting on the plurality of rear surface patterns 423 and the thermal stress acting on the plurality of front surface patterns 421 are balanced.

Furthermore, although the constitution in which the thickness of the connection pattern 424 is 50 µm or less is described in the embodiment, the thickness of the connection pattern 424 of the present disclosure is not limited to this numerical value. The thickness of the connection pattern 424 may be, for example, one-fifth or less of the thickness of the rear surface patterns 423 (the front surface patterns 421).

In addition, although a constitution in which the thickness of the connection pattern 424 is thinner than the thicknesses of the front surface patterns 421 and the rear surface patterns 423 is described in the embodiment, the present disclosure is not limited to this constitution. For example, if the connection pattern 424 electrically connects the rear surface patterns 423 so that the thermal stress acting on the front surface patterns 421 and the thermal stress acting on the rear surface patterns 423 are balanced and so that the thermal expansion of the rear surface patterns 423 is not prevented, the thickness of the connection pattern 424 may be greater than or equal to the thickness of the rear surface patterns 423.

Moreover, although the constitution in which the connection pattern 424 is the metal pattern disposed in the gap R to fill the rear surface 420b in the gap R between the neighboring rear surface patterns 423 is described in the embodiment, the present disclosure is not limited to this constitution. For example, the constitution in which the plurality of connection patterns 424 are disposed at intervals so that each of the connection patterns 424 serves as a bridge between the rear surface patterns 423 in the gap R between the rear surface patterns 423 and the connection pattern 424 electrically connects the neighboring rear surface patterns 423 may be provided.

Also, although the constitution in which each of the front surface patterns 421, the rear surface patterns 423, and the connection pattern 424 is a copper pattern is described in the embodiment, the present disclosure is not limited to this constitution. The front surface patterns 421, the rear surface patterns 423, or the connection pattern 424 may be formed of aluminum, an alloy, or the like. In this case, the metal pattern used in the front surface pattern formation step S1, the rear surface pattern formation step S2, or the connection pattern formation step S3 in the method of producing the substrate 42 for a power module is formed of aluminum, an alloy, or the like. Furthermore, the connection pattern 424 may be formed of solder or the like.

In addition, the front surface patterns 421 may be formed of copper and the rear surface patterns 423 may be formed of aluminum. Furthermore, the front surface patterns 421 may be formed of aluminum and the rear surface patterns 423 may be formed of copper. Therefore, the front surface patterns 421 and the rear surface patterns 423 may be formed of different metal materials.

Also, although the constitution in which the first surface 41a and the second surface 41b of the base plate 41 and the front surface 420a and the rear surface 420b of the insulation sheet 420 have a relationship in which they are disposed back-to-back in a state in which they are parallel each other is described in the embodiment, the present disclosure is not limited to this constitution and they may be slightly inclined to each other.

Also, although the inverter is described as an example of the power conversion device 100 in the embodiment, the power conversion device 100 of the present disclosure is not limited to the inverter. The power conversion device 100 may be, for example, a device which converts electric power using the power semiconductor elements 422 such as a converter and a device obtained by combining an inverter and a converter. When the power conversion device 100 is a converter, the power conversion device 100 may have a constitution in which an AC voltage is input from an external input power supply (not shown) to the outside output conductor 43, the power semiconductor elements 422 converts the AC voltage into a DC voltage, and the DC voltage from the power semiconductor elements 422 is output from an input part (the connection conductor 5).

Furthermore, although the connection pattern formation step S3 is performed after the rear surface pattern formation step S2 in the method of producing the substrate 42 for a power module described in the embodiment, the present disclosure is not limited thereto. The connection pattern formation step S3 may be omitted and the rear surface patterns 423 and the connection pattern 424 may be integrally formed on the rear surface 420b of the insulation sheet 420 from the beginning, for example, using a lamination shaping device such as a metal 3D printer in the rear surface pattern formation step S2.

In addition, the rear surface pattern formation step S2 is performed after the front surface pattern formation step S1 in the method of producing the substrate 42 for a power module described in the embodiment, the present disclosure is not limited thereto. The front surface pattern formation step S1 may be performed after the connection pattern formation step S3. In this case, the power semiconductor element connection step S3 is performed after the front surface pattern formation step S1.

<Supplementary Note>

The substrate for a power module and the method of producing the substrate for a power module described in the embodiment are ascertained, for example, as follows.

(1) A substrate 42 for a power module according to a first aspect includes: an insulation sheet 420; a plurality of front surface patterns 421 formed on a front surface 420a of the insulation sheet 420 and disposed adjacent to each other with a gap R between the plurality of front surface patterns 421 in a direction in which the insulation sheet 420 expands; a power semiconductor element 422 connected to the front surface pattern 421; a plurality of rear surface patterns 423 formed on a rear surface 420b of the insulation sheet 420 and disposed adjacent to each other with a gap R between the plurality of rear surface patterns 423 in the direction in which the insulation sheet 420 expands; and a connection pattern 424 disposed in the gap R to fill the rear surface 420b in the gap R between the neighboring rear surface patterns 423 of the plurality of rear surface patterns 423 and configured to electrically connect the neighboring rear surface patterns 423, in which each of the rear surface patterns 423 and at least one front surface pattern 421 of the plurality of front surface patterns 421 overlap with the insulation sheet 420 disposed therebetween in a direction perpendicular to the insulation sheet 420, and the plurality of rear surface patterns 423 are formed so that thermal stress acting on the plurality of rear surface patterns 423 and thermal stress acting on the plurality of front surface patterns 421 are balanced.

Thus, the front surface patterns 421 and the rear surface patterns 423 thermally expand in the same way. Furthermore, since a thickness of the connection pattern 424 is thinner than a thickness of the rear surface pattern 423, it is possible to prevent the occurrence of a difference in thermal stress between the front surface 420a side and the rear surface 420b side, compared to the constitution in which the rear surface pattern 423 that is a single metal pattern is formed (the constitution in which, on the rear surface 420b of the insulation sheet 420, only one rear surface pattern 423 that is a metal pattern is formed). In addition, since the connection pattern 424 electrically connects the neighboring rear surface patterns 423, a path of an overcurrent flowing through the rear surface patterns 423 is not blocked.

(2) A substrate 42 for a power module according to a second aspect is the substrate 42 for a power module in (1), in which a thickness of the connection pattern 424 may be thinner than a thickness of each of the plurality of the rear surface patterns 423.

Thus, it is possible to realize the above actions by a more specific constitution. Furthermore, it is possible to further prevent deformation of the substrate 42 for a power module.

(3) A substrate 42 for a power module according to a third aspect is the substrate 42 for a power module in (1) or (2), in which the number of the rear surface patterns 423 may be the same as the number of the front surface patterns 421.

Thus, it is possible to realize the above actions by a more specific constitution. Furthermore, it is possible to further prevent deformation of the substrate 42 for a power module.

(4) A substrate 42 for a power module according to a fourth aspect is the substrate 42 for a power module in any one of (1) to (3), in which the front surface pattern 421 and the rear surface pattern 423 facing each other with the insulation sheet 420 disposed therebetween in a direction perpendicular to the insulation sheet 420 may have the same shape.

Thus, it is possible to realize the above actions by a more specific constitution. Furthermore, it is possible to further prevent deformation of the substrate 42 for a power module.

(5) A method of producing a substrate 42 for a power module according to a fifth aspect includes: a front surface pattern formation step S1 of forming a plurality of front surface patterns 421 disposed adjacent to each other with a gap R between the plurality of front surface patterns 421 in a direction in which an insulation sheet 420 expands on a front surface 420a of the insulation sheet 420; a rear surface pattern formation step S2 of forming a plurality of rear surface patterns 423 disposed adjacent to each other with a gap R between the plurality of rear surface patterns 423 in the direction in which the insulation sheet 420 expands on a rear surface 420b of the insulation sheet 420; a connection pattern formation step S3 of forming a connection pattern 424 disposed in the gap R between the neighboring rear surface patterns of the plurality of rear surface patterns to fill the rear surface 420b in the gap R between the neighboring rear surface patterns 423 and electrically connecting the neighboring rear surface patterns 423; and a power semiconductor element connection step S4 of connecting a power semiconductor element 422 to the front surface pattern 421, in which each of the rear surface patterns 423 and at least one front surface pattern 421 of the plurality of front surface patterns 421 overlap with the insulation sheet 420 disposed therebetween in a direction perpendicular to the insulation sheet 420, and the plurality of rear surface patterns 423 are formed so that thermal stress acting on the plurality of rear surface patterns 423 and thermal stress acting on the plurality of front surface patterns 421 are balanced.

Thus, it is possible to produce the substrate 42 for a power module capable of reducing parasitic inductance while preventing the deformation thereof caused by the generation of thermal stress.

According to the present disclosure, it is possible to provide the substrate 42 for a power module capable of reducing parasitic inductance while preventing deformation thereof caused by generation of thermal stress and the method of producing the substrate 42 for a power module.

While preferred embodiments of the invention are described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 Casing
1a Input-side lateral surface
1b Output-side lateral surface
2 External input conductor
3 Capacitor
4 Power conversion part
5 Connection conductor
6 Cooling device
10 Power module
41 Base plate
41a First surface
41b Second surface
42 Substrate for power module
43 Outside output conductor
44 Reinforcing part
51 First conductor
52 Second conductor
100 Power conversion device
420 Insulation sheet
420a Front surface
420b Rear surface
421 Front surface pattern
421a First front surface pattern
421b Second front surface pattern
421c Third front surface pattern
422 Power semiconductor element
422a First power semiconductor element
422b Second power semiconductor element
423 Rear surface pattern
423a First rear surface pattern
423b Second rear surface pattern
423c Third rear surface pattern
424 Connection pattern
P Potting space
R Gap
S Bonding material
S1 Front surface pattern formation step
S2 Rear surface pattern formation step
S3 Connection pattern formation step
S4 Power semiconductor element connection step

What is claimed is:
1. A substrate for a power module, comprising:
an insulation sheet;
a plurality of front surface patterns formed on a front surface of the insulation sheet and disposed adjacent to each other with a gap between the plurality of front surface patterns in a direction in which the insulation sheet expands;
a power semiconductor element connected to one front surface pattern of the plurality of front surface patterns;
a plurality of rear surface patterns formed on a rear surface of the insulation sheet and disposed adjacent to each other with a gap between the plurality of rear surface patterns in the direction in which the insulation sheet expands; and
a connection pattern disposed in the gap between neighboring rear surface patterns of the plurality of rear surface patterns to fill the rear surface in the gap between the neighboring rear surface patterns of the plurality of rear surface patterns and configured to electrically connect the neighboring rear surface patterns, wherein each of the plurality of rear surface patterns and at least one front surface pattern of the plurality of front surface patterns overlap the insulation sheet disposed therebetween in a direction perpendicular to the insulation sheet, the plurality of rear surface patterns are formed so that thermal stress acting on the plurality of rear surface patterns and thermal stress acting on the plurality of front surface patterns are balanced, and a thickness of the connection pattern in the direction perpendicular to the insulation sheet is thinner than a thickness of each of the plurality of rear surface patterns in the direction perpendicular to the insulation sheet.

2. The substrate for a power module according to claim 1, wherein the number of the rear surface patterns is the same as the number of the front surface patterns.

3. The substrate for a power module according to claim 1, wherein a front surface pattern of the plurality of front surface patterns and a rear surface pattern of plurality of rear surface patterns facing each other with the insulation sheet disposed therebetween in the direction perpendicular to the insulation sheet have the same shape.

4. A method of producing a substrate for a power module, comprising:

a front surface pattern formation step of forming a plurality of front surface patterns disposed adjacent to each other with a gap between the plurality of front surface patterns in a direction in which an insulation sheet expands on a front surface of the insulation sheet;

a rear surface pattern formation step of forming a plurality of rear surface patterns disposed adjacent to each other with a gap between the plurality of rear surface patterns in the direction in which the insulation sheet expands on a rear surface of the insulation sheet;

a connection pattern formation step of forming a connection pattern disposed in the gap between the neighboring rear surface patterns of the plurality of rear surface patterns to fill the rear surface in the gap between the neighboring rear surface patterns and electrically connecting the neighboring rear surface patterns; and a power semiconductor element connection step of connecting a power semiconductor element to one of the plurality of front surface patterns, wherein each of the plurality of rear surface patterns and at least one front surface pattern of the plurality of front surface patterns overlap the insulation sheet disposed therebetween in a direction perpendicular to the insulation sheet, and the plurality of rear surface patterns are formed so that thermal stress acting on the plurality of rear surface patterns and thermal stress acting on the plurality of front surface patterns are balanced.

* * * * *